United States Patent
Shan et al.

(10) Patent No.: US 7,983,100 B2
(45) Date of Patent: Jul. 19, 2011

(54) METHOD FOR GENERATING READ ENABLE SIGNAL AND MEMORY SYSTEM USING THE METHOD

(75) Inventors: Gang Shan, Shanghai (CN); Larry Wu, Shanghai (CN)

(73) Assignee: Montage Technology (Shanghai) Co., Ltd., Shanghai (CN)

( * ) Notice: Subject to any disclaimer, the term of this patent is extended or adjusted under 35 U.S.C. 154(b) by 90 days.

(21) Appl. No.: 12/544,602

(22) Filed: Aug. 20, 2009

(65) Prior Publication Data
US 2011/0007585 A1    Jan. 13, 2011

(30) Foreign Application Priority Data
Jul. 13, 2009   (CN) .......................... 2009 1 0054716

(51) Int. Cl.
*G11C 7/00* (2006.01)
(52) U.S. Cl. ............... 365/193; 365/189.05; 365/189.15
(58) Field of Classification Search .......... 365/193–194, 365/189.05, 189.15, 181, 189.17
See application file for complete search history.

(56) References Cited

U.S. PATENT DOCUMENTS

| | | | |
|---|---|---|---|
| 6,671,211 B2 * | 12/2003 | Borkenhagen et al. | 365/189.05 |
| 7,782,685 B2 * | 8/2010 | Kim et al. | 365/193 |

* cited by examiner

*Primary Examiner* — David Lam
(74) *Attorney, Agent, or Firm* — Jun He Law Offices P.C.; James Zhu

(57) ABSTRACT

A method for generating a read enable signal which is for controlling reading of a pair of data strobe signals and a data signal in a memory system is provided. The method comprises: detecting whether the pair of data strobe signals are both high or low; and generating the read enable signal if the pair of data strobe signals are detected being both high or low. Because the read enable signal is generated using the pair of strobe signals, DLL can be turned off, thus the power consumption of the memory system can be reduced. In addition, the read enable signal is self-aligned with a certain point of the pair of strobe signals, this may enhance precision of the transmission of the pair of strobe signals and the data signal.

11 Claims, 6 Drawing Sheets

METHOD FOR GENERATING READ ENABLE SIGNAL AND MEMORY SYSTEM USING THE METHOD

PRIORITY CLAIM

This application claims the benefit of Chinese patent application number 200910054716.9, filed Jul. 13, 2009, which is incorporated herein by reference in its entirety.

BACKGROUND

DDR (Double Data Rate) interface is widely used in memory systems of computing systems. As memory systems become faster and larger, they have become a heavy burden of power systems of computing systems, and the burden will be even heavier with the increasing operating speed and the capacity of the memory systems, and signal integrity will become an issue.

To address the issues mentioned above, the industry proposed fully buffered memory architectures such as FB-DIMM (Fully Buffered Dual In Line Memory Module) and LR-DIMM (Load-Reducing Dual In Line Memory Module). Each of such DIMMs has one or more buffers thereon to buffer data exchange between DRAMs (Dynamic Random Access Memory) on the DIMMs and a memory controller or a host. Each buffer provides a clock signal for read/write operations to the corresponding DRAMs using a multi-drop (fly-by) topology, so there will be phase difference between the clock signals received by different DRAMs due to different trace lengths. To ensure proper data transmission, each DRAM aligns its data signal (DQ) and a pair of data strobe signals (DQS/DQS#) with the received clock signal when sending the signals to the buffer, wherein DQS signal and DQS# signal are a pair of differential signals. But the phase relationship between the DQ/DQS/DQS# signals and the received clock signal may change with process, voltage, and temperature variations over time, leading to reduced timing margin for the buffer. The problem gets worse when data speed increases and even makes the buffer not being able to receive data correctly from the DRAMs. So conventionally, each DRAM incorporates a DLL (Delay Lock Loop) or PLL (Phase Lock Loop) to track the phase change of DQ/DQS/DQS# signals and maintain a fixed timing relationship between DQ/DQS/DQS# signals and the received clock signal, thus to ensure DQ/DQS/DQS# signals received by the buffer are covered by a read enable signal, which controls reading of DQ/DQS/DQS# signals by the buffer, on time axis, and thus to ensure proper transmission of the signals. However, since the DLLs are enabled to run whenever there is read/write operation, the power consumption of the DLLs is great, especially for memory systems with multi-rank (4, 8, or more) of DRAMs.

Therefore, it is necessary to provide a new method and a new memory system to solve the problems mentioned above.

SUMMARY

In one aspect, the present application is related to a method for generating read enable signal, especially a method for generating read enable signal using data strobe signals.

In another aspect, the present application is related to a data exchanging device, especially a data exchanging device that can generate read enable signal using data strobe signals.

In another aspect, the present application is related to a buffer, especially a buffer that can generate read enable signal using data strobe signals.

In another aspect, the present application is related to a memory controller, especially a memory controller that can generate read enable signal using data strobe signals.

In one aspect, the present application provides a method for generating read enable signal. Read enable signal is used to control reading of data signal and data strobe signals. The method comprises: detecting whether a pair of data strobe signals are both high or low; and generating a read enable signal if the pair of data strobe signals are detected being both high or low.

In one embodiment, the method further comprises: generating the pair of data strobe signals comprising a segment in which the pair of data strobe signals are both high or low.

In one embodiment, the pair of data strobe signals comprises in order of time: a trigger segment, a pre-amble segment, and a strobe segment. The pair of data strobe signals are both high or low in the trigger segment, and are differential signals in the pre-amble segment and the strobe segment.

In one embodiment, the method further comprises: generating a trigger signal if the pair of data strobe signals are detected being both high or low. In the method, the read enable signal is generated after the trigger signal is detected.

In one embodiment, the read enable signal is generated by a data exchanging device for exchanging data with a memory chip. The data signal and the pair of data strobe signals are generated by the memory chip. In one embodiment, the memory chip is mounted on a memory module. In one embodiment, the memory chip may be a DRAM chip.

In one embodiment, the data exchanging device is a buffer mounted on the memory module for buffering data exchanges between the memory chip and a memory controller.

In one embodiment, the data exchanging device is a memory controller for controlling reading data from and writing data to the memory chip.

In another aspect, the present application provides a data exchanging device for exchanging data with a memory chip. The data exchanging device comprises: a data signal receiver for reading in a data signal under the control of a read enable signal; a strobe signal receiver for reading in a pair of data strobe signals under the control of the read enable signal; and a enable signal generator for generating the read enable signal. The data exchanging device further comprises a strobe signal detector for detecting whether the pair of data strobe signals are both high or low, and generating a trigger signal if the pair of data strobe signals being both high or low is detected. If the enable signal generator receives the trigger signal, it generates the read enable signal.

In one embodiment, the data exchanging device is a buffer for buffering data exchanges between the memory chip and a memory controller. The buffer and the memory chip are mounted on the same memory module.

In one embodiment, the data exchanging device is a memory controller for controlling reading data from and writing data to the memory chip.

The method and the data exchanging device of the present application can ensure proper transmission of signals between a memory chip and a data exchanging device without DLL being incorporated in the memory chip, thus power consumption of memory systems can be reduced. In addition, because read enable signal is generated using data strobe signals, in other words, the time relationship between read enable signal and data strobe signals is fixed no matter whether process, temperature, and voltage change or not.

BRIEF DESCRIPTION OF THE DRAWINGS

The accompanying drawings are included to provide a further understanding of the present application and are incorporated in and constitute a part of this specification. The drawings illustrate the embodiments of the present application and together with the description serve to explain the principles of the application. Other embodiments of the present application and many of the intended advantages of the present application will be readily appreciated, as they become better understood by reference to the following detailed description. The elements of the drawings are not necessarily to scale relative to each other. Like reference numerals designate corresponding similar parts.

DETAILED DESCRIPTION

In the following detailed description, reference is made to various specific embodiments of the invention. These embodiments are described with sufficient detail to enable those skilled in the art to practice the application. It is to be understood that other embodiments may be employed, and that various structural, logical and electrical changes may be made without departing from the spirit or scope of the application.

Figure 1:
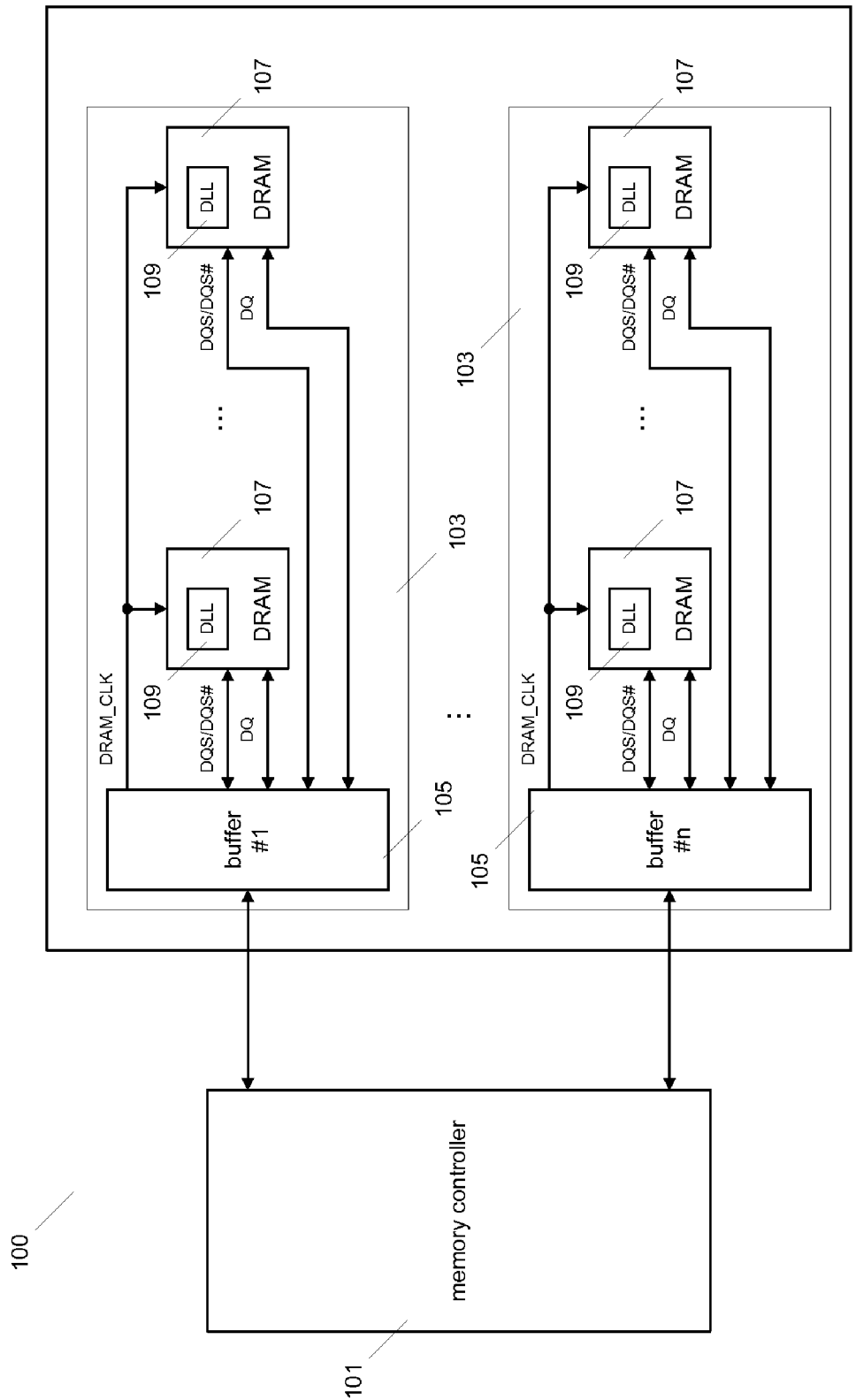
FIG. 1 illustrates a block diagram of a memory system in one embodiment of the present application.

Referring to FIG. 1, illustrates a block diagram of memory system 100. Memory system 100 comprises memory controller 101 and a plurality of memory modules 103. Each memory module 103 comprises a buffer 105 and a plurality of memory chips 107. Each memory chip 107 comprises a DLL 109 for aligning data signal (DQ) and a pair of data strobe signals (DQS/DQS#) generated by memory chip 107 with clock signal (DRAM_CLK) received by memory chip 107. Memory modules 103 exchange data with memory controller 101 through corresponding buffers 105. Optionally, a memory module may comprise two or more buffers thereon. Memory chips 107 may be DRAM chips like DDR, DDR2, DDR3, DDR4 chips etc.

Figure 2:
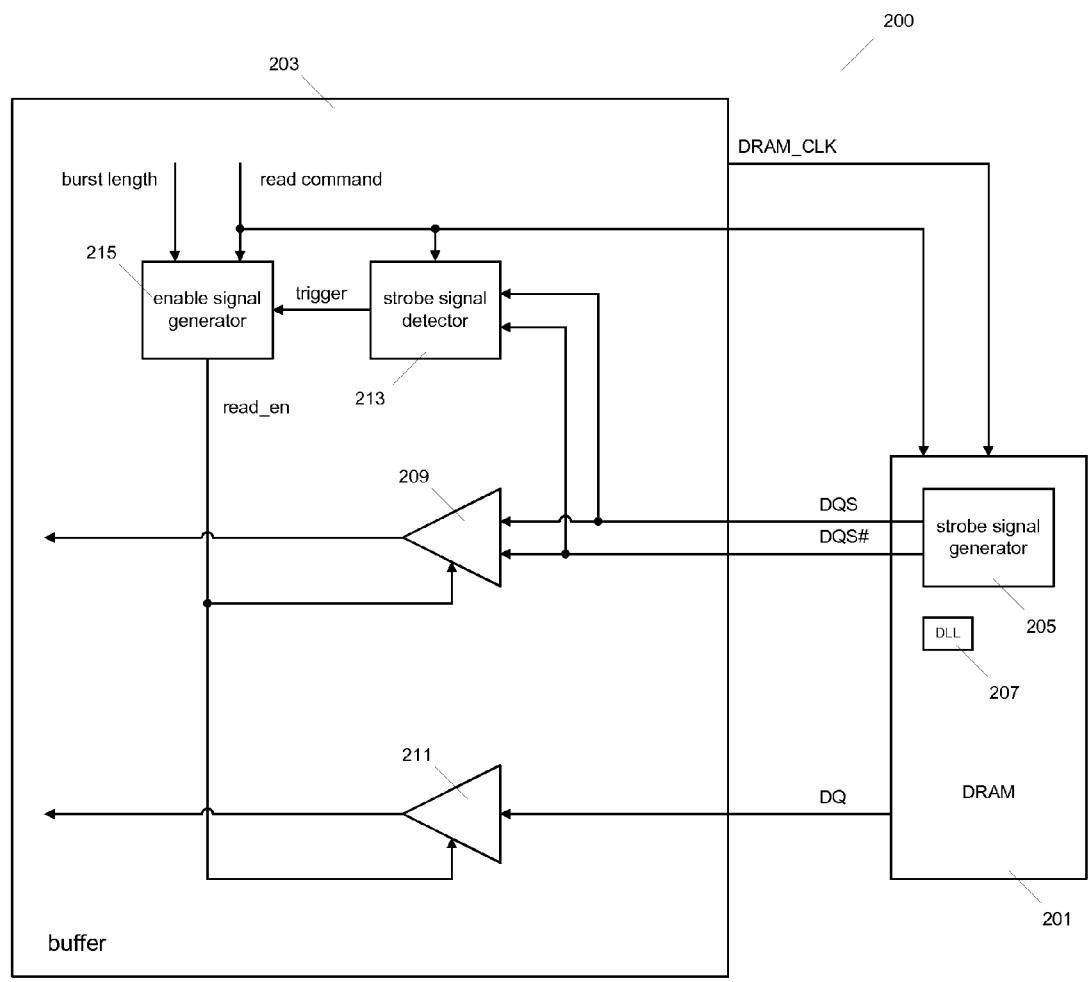
FIG. 2 illustrates a block diagram of a memory module in one embodiment of the present application.

Referring to FIG. 2, illustrates a block diagram of memory module 200 in one embodiment of the present application. Memory module 200 comprises memory chip 201 and buffer 203. Memory chip 201 comprises strobe signal generator 205 and DLL 207. Strobe signal generator 205 generates a pair of data strobe signals (DQS/DQS#) when memory chip 201 receives read command signal (read_command). Buffer 203 comprises strobe signal receiver 209, data signal receiver 211, strobe signal detector 213, and enable signal generator 215. Strobe signal receiver 209 and data signal receiver 211 are connected with and controlled by enable signal generator 215. Strobe signal receiver 209 is turned on to read in data strobe signals (DQS/DQS#) when it receives read enable signal (read_en). Data signal receiver 211 is turned on to read in data signal (DQ) when it receives read enable signal (read_en). Enable signal generator 215 is connected with and controlled by strobe signal detector 213. Optionally, memory module 200 may comprise two or more memory chips thereon.

Memory module 200 has two working modes, normal mode and power saving mode. Under normal mode, DLL 207 is turned on. Enable signal generator 215 generates read enable signal (read_en) a certain time period after it receives read command signal (read_command). Memory chip 201 generates data strobe signals (DQS/DQS#) and data signal (DQ) after it receives read command signal (read_command). DLL 207 aligns data strobe signals (DQS/DQS#) and data signal (DQ) with clock signal (DRAM_CLK) received by memory chip 201, or maintains a fixed timing relationship between data strobe signals (DQS/DQS#) data signal (DQ), and clock signal (DRAM_CLK), to ensure data strobe signals (DQS/DQS#) received by strobe signal receiver 209 being covered by read enable signal (read_en) received by strobe signal receiver 209 on time axis, and data signal (DQ) received by data signal receiver 211 being covered by read enable signal (read_en) received by data signal receiver 211 along time axis, thus to ensure proper transmission of data strobe signals (DQS/DQS#) and data signal (DQ). The working process of memory module 200 under normal mode is similar to that of conventional memory modules, therefore, it will not be described in more detail here.

Under power saving mode, DLL 207 is turned off. Strobe signal generator 205 generates data strobe signals (DQS/DQS#), which are both high or low during a certain time period from beginning, after it receives read command signal (read_command). Strobe signal detector 213 receives data strobe signals (DQS/DQS#) and detects whether data strobe signals (DQS/DQS#) are both high or low, and generates trigger signal (trigger) if data strobe signals are detected being both high or low. Enable signal generator 215 generates read enable signal (read_en) after it receives trigger signal (trigger) from strobe signal detector 213. The duration of read enable signal (read_en) is decided based on burst length and settings of memory system. Because read enable signal (read_en) is generated using data strobe signals (DQS/DQS#), read enable signal (read_en) can be aligned with a certain point of data strobe signals (DQS/DQS#) according to a setting regarding a delay inserted in the generation of read enable signal (read_en). Therefore it is very easy to ensure substantial part of data strobe signals (DQS/DQS#) received by strobe signal receiver 209 being covered on time axis by read enable signal (read_en) received by strobe signal receiver 209, and data signal (DQ) received by data signal receiver 211 being covered on time axis by read enable signal (read_en) received by data signal receiver 211, thus to ensure proper transmission of data strobe signals (DQS/DQS#) and data signal (DQ). Substantial part of a pair of data strobe signals is equivalent to a pair of conventional data strobe signals i.e. having a pre-amble segment and a strobe segment for strobe of data signal (DQ).

In one embodiment, to further reduce power consumption, under normal mode, strobe signal detector 213 is turned off. Under power saving mode, strobe signal detector 213 is turned on only when read command signal (read_command) is detected, and is turned off when a write command signal or an idle signal is detected.

In one embodiment, optionally, read command signal (read_command) is used as a coarse reference for generation of read enable signal (read_en), for example, when enable signal generator 215 receives read command signal (read_command), it prepares to generate read enable signal (read_en), and decides when to generate read enable signal (read_en) using trigger signal (trigger).

In one embodiment, a delay can be inserted before and/or after the generation of read enable signal (read_en). For example, a programmable delay chain may be inserted in the path for transmitting trigger signal (trigger) between strobe signal detector 213 and enable signal generator 215. Also, a programmable delay chain may be added after the output of enable signal generator 215.

In conventional process, a complete strobe signal is followed by a floating period in which the pair of strobe signals may be both high or low. If such situation is detected by strobe signal detector 213, it will generate in wrong a trigger signal, and then enable signal generator 215 will generate in wrong a read enable signal. To address this issue, in one embodiment, strobe signal generator 205 will keep the pair of strobe signals differential after the complete strobe signal.

Figure 3:
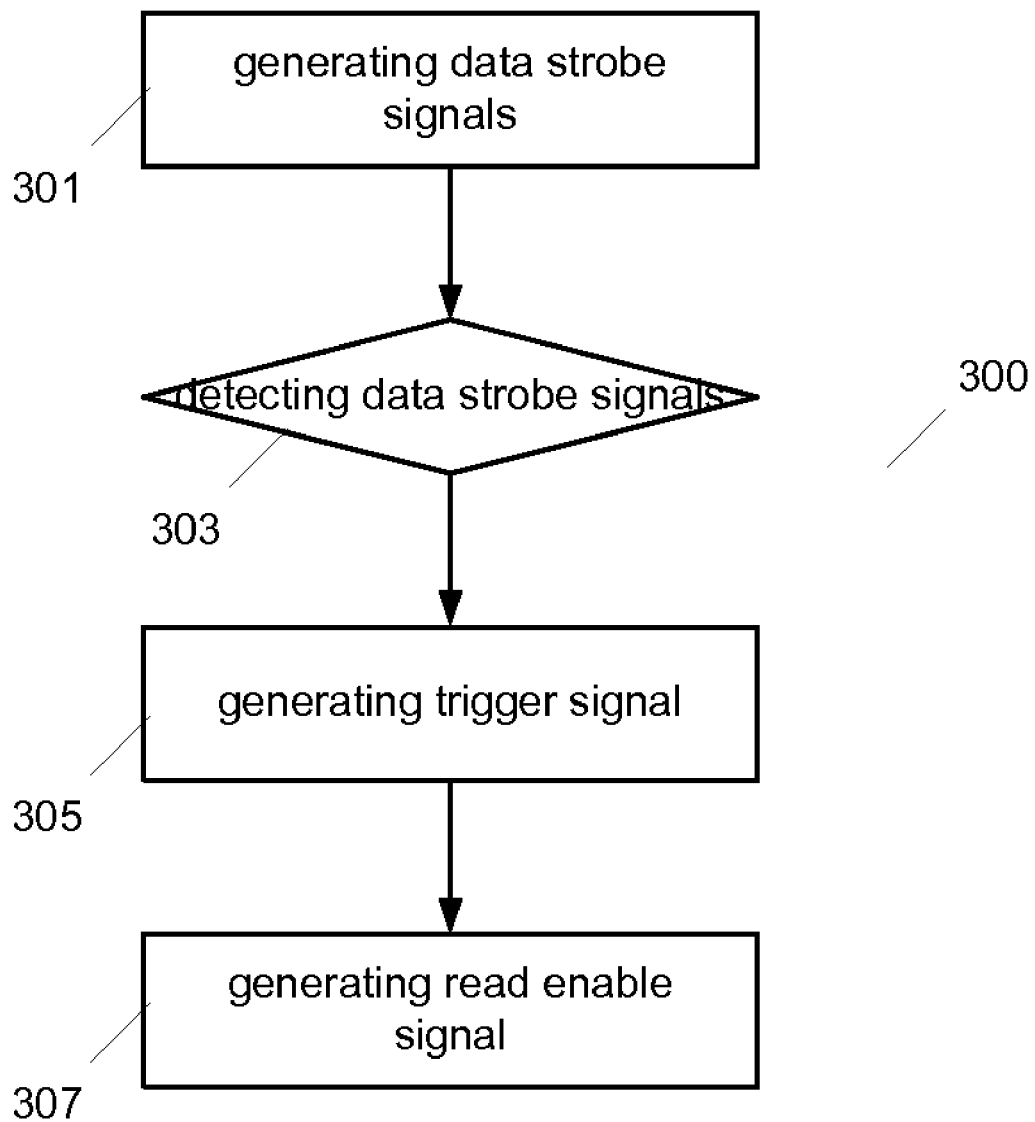
FIG. 3 illustrates a flow chart of a method for generating read enable signal in one embodiment of the present application.

Referring to FIG. 3, illustrates a flow chart of a method 300 for generating read enable signal in one embodiment of the present application. Method 300 comprises: a memory chip generating a pair of data strobe signals after it receives a read command signal, the pair of data strobe signals being both high or low in a certain time period from beginning (step 301); detecting whether the data strobe signals are both high or low (step 303); generating a trigger signal if the data strobe signals are detected being both high or low (step 305); and generating a read enable signal having a certain duration if the trigger signal is detected, wherein the duration of the read enable signal is decided based on burst length and related settings of the memory system (step 307). The strobe signals may comprise a trigger segment, a pre-amble segment, and a strobe segment. In the trigger segment, the strobe signals are both high or low to trigger generation of the read enable signal. The pre-amble segment is the first segment where the data strobe signals are differential signals, and allows the buffer to get prepared to read in the data strobe signals and a corresponding data signal. The strobe segment is for reading the data signal. Burst length may be set at 4, 8 etc. The related settings of the memory system include but not limited to the length of the pre-amble segment and the length of post-amble. The lengths of the pre-amble segment and post-amble may be set according to the performance of the memory system.

In one embodiment, the pair of strobe signals further comprises a floating segment following the strobe segment. In the floating segment, one strobe signal is kept high and the other strobe signal is kept low.

Figure 4:
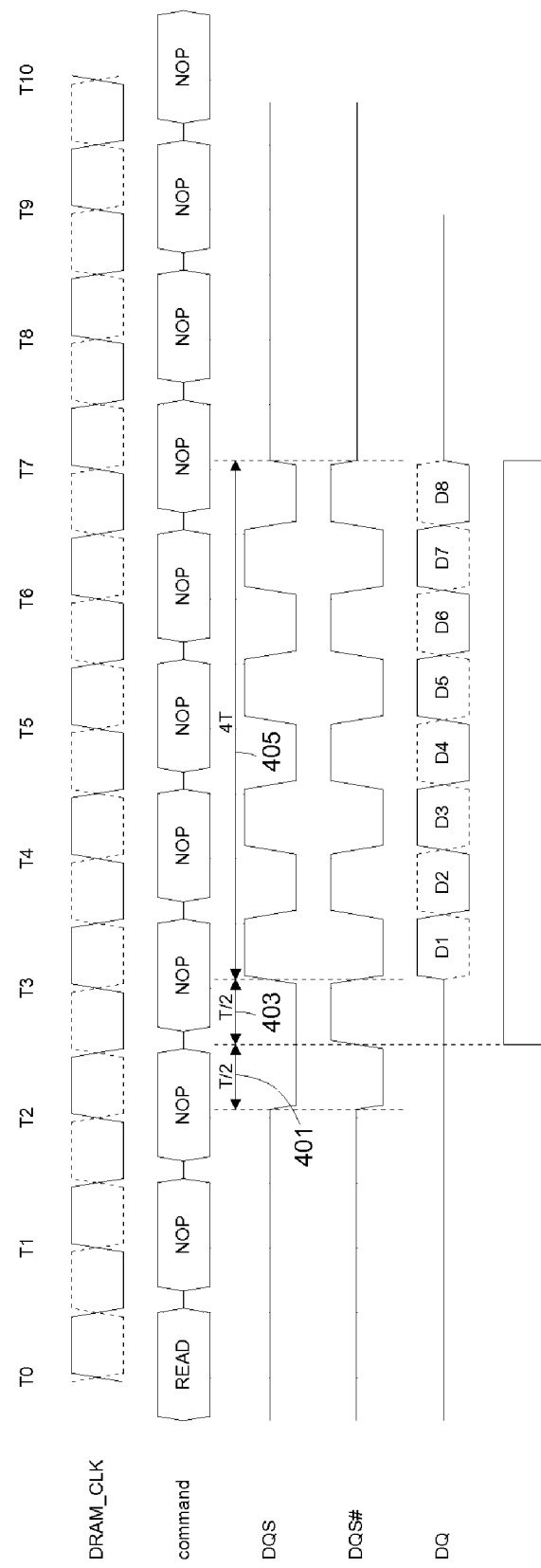
FIG. 4 illustrates a time sequence diagram in one embodiment of the present application.

Referring to FIG. 4, illustrates a time sequence diagram of one embodiment of the present application. Where DRAM_CLK is a clock signal received by a memory chip in a memory system. Command represents command signal received by a buffer in the memory system. DQS and DQS# represent a pair of data strobe signals having trigger segment 401, pre-amble segment 403 and strobe segment 405 received by the buffer from the memory chip. Read_en represents a read enable signal generated by an enable signal generator of the memory system. In the embodiment, burst length is set at 8. To enhance performance of the memory system, the length of pre-amble segment 403 is set at 0.5 clock cycle of the clock signal. The duration of the read enable signal is set at 4.5 clock cycles of the clock signal. When the working frequency of the memory system is relatively low, the length of trigger segment 401 can be set at 0.5 clock cycle. In one embodiment, read enable signal is generated about 0.5 clock cycle after data strobe signals being both high or low are detected.

Figure 5:
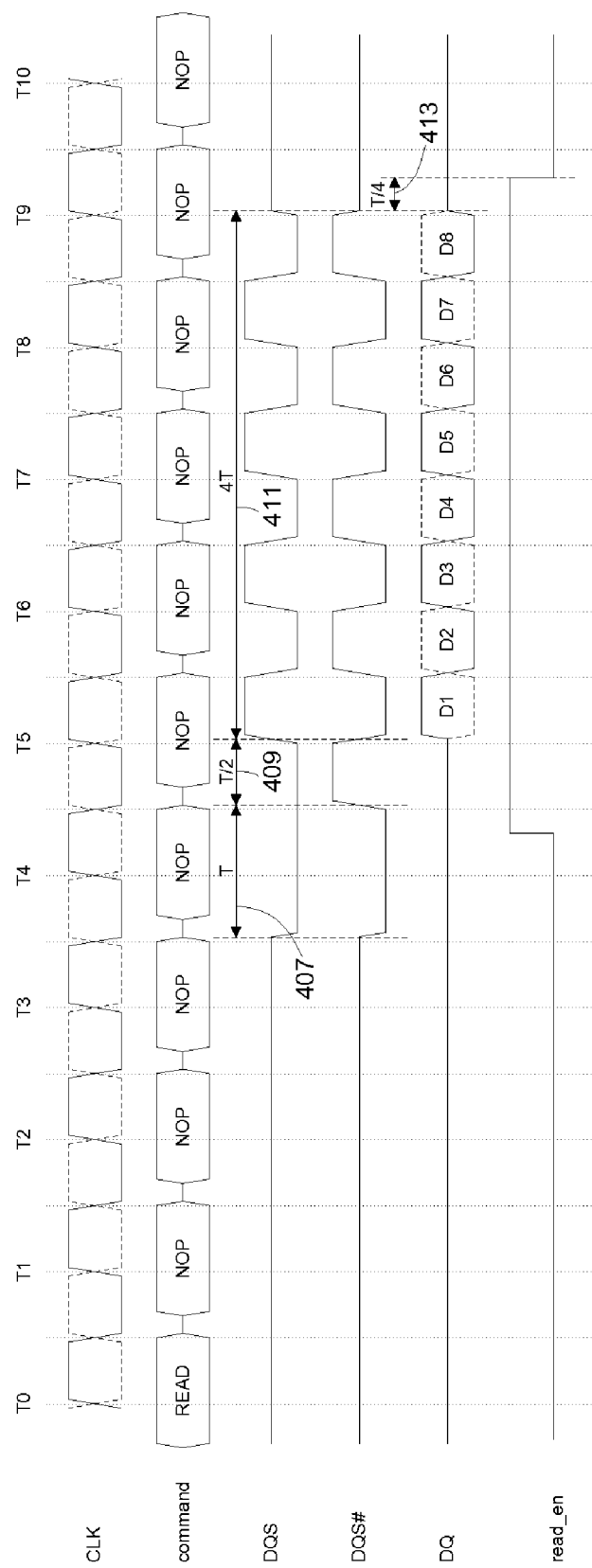
FIG. 5 illustrates a time sequence diagram in another embodiment of the present application.

When the working frequency of the memory system is relatively high, it may cost more than 0.5 clock cycle from detection of data strobe signals being both high or low to generation of read enable signal. Therefore, length of trigger segment of data strobe signals can be set according to the specific circumstances, for example it can be set at 1 clock cycle. To enhance performance of memory system, the length of pre-amble segment can be set at 0.5 clock cycle. Referring to FIG. 5, illustrates a time sequence diagram of another embodiment of the present application. In this embodiment, burst length is set at 8, length of trigger segment 407 of data strobe signals is set at 1 clock cycle, length of pre-amble segment 409 is set at 0.5 clock cycle, and length of strobe segment 411 is set at 4 clock cycles. To reduce impact of ring back on data transmission, read enable signal is delayed by ¼ clock cycle, the time period from the end of strobe signals and the end of read enable signal is called post-amble 413. The amount of the delay may be set according to specific circumstances like duration of ring back. Length of pre-amble segment may be set according to system performance, if system performance is good, length of pre-amble may be set shorter, vice versa, it may be set longer.

The methods and structures of the present application may be used not only in buffered memory systems e.g. Fully Buffered DIMM, but also in non-buffered memory systems.

Figure 6:
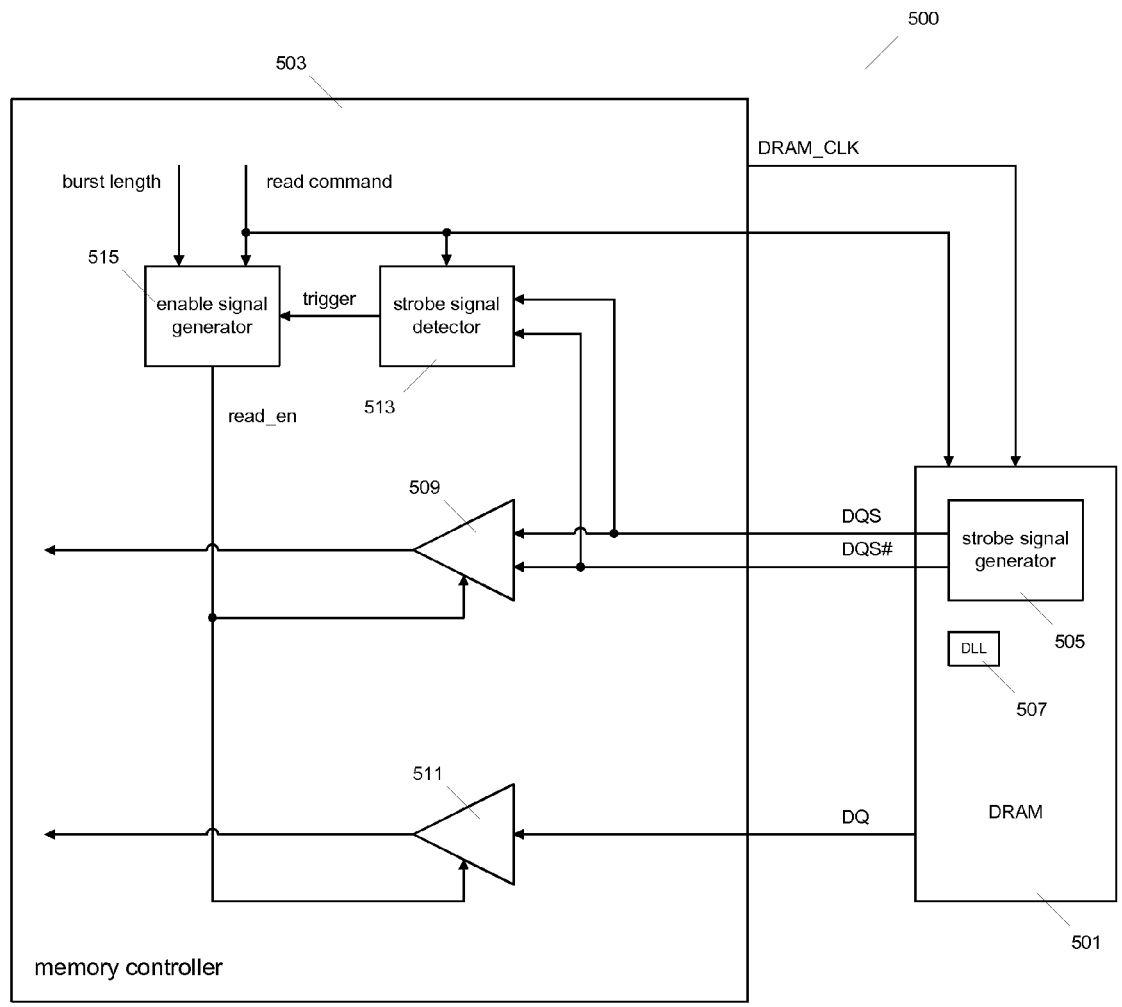
FIG. 6 illustrates a block diagram of a memory system in another embodiment of the present application.

Referring to FIG. 6, illustrates a block diagram of memory system 500 in one embodiment of the present application. Memory system 500 comprises memory chip 501 and memory controller 503 which exchange data with each other directly. Memory chip 501 comprises strobe signal generator 505 and DLL 507. Strobe signal generator 505 generates a pair of data strobe signals (DQS/DQS#) corresponding to read command signal (read_command) received by memory chip 501. Memory controller 503 comprises strobe signal receiver 509, data signal receiver 511, strobe signal detector 513, and enable signal generator 515. Strobe signal receiver 509 and data signal receiver 511 are connected with and controlled by enable signal generator 515. Strobe signal receiver 509 is turned on to read in data strobe signals (DQS/DQS#) when it receives read enable signal (read_en) generated by enable signal generator 515. Data signal receiver 511 is turned on to read in data signal (DQ) when it receives read enable signal (read_en) generated by enable signal generator 515. Enable signal generator 515 is connected with and controlled by strobe signal detector 513. Optionally, memory system 500 may comprise two or more memory chips.

Memory system 500 has two working modes, normal mode and power saving mode. Under normal mode, DLL 507 is turned on. Enable signal generator 515 generates read enable signal (read_en) a certain time period after it receives read command signal (read_command). Memory chip 501 generates data strobe signals (DQS/DQS#) and data signal (DQ) after it receives read command signal (read_command). Data strobe signals (DQS/DQS#) and data signal (DQ) are aligned with clock signal received by memory chip 501 (DRAM_CLK) using DLL 507, or the timing relationship between Data strobe signals (DQS/DQS#), data signal (DQ), and clock signal (DRAM_CLK) received by memory chip 501 is maintained fixed, to ensure substantial part of data strobe signals (DQS/DQS#) received by strobe signal receiver 509 being covered by read enable signal (read_en) received by strobe signal receiver 509 on time axis, and data signal (DQ) received by data signal receiver 511 being covered by read enable signal (read_en) received by data signal receiver 511 on time axis, thus to ensure proper transmission of data strobe signals (DQS/DQS#) and data signal (DQ). The working process of memory system 500 under normal mode is similar to that of conventional memory systems, therefore, it will not be described in more detail here.

Under power saving mode, DLL 507 is turned off. Strobe signal generator 505 generates data strobe signals (DQS/DQS#), which are both high or low during a certain time period from beginning, after it receives read command signal (read_command). Strobe signal detector 513 receives data strobe signals (DQS/DQS#) and detects whether data strobe signals (DQS/DQS#) are both high or low, and generates trigger signal (trigger) if data strobe signals are detected being both high or low. Enable signal generator 515 generates read enable signal (read_en) after it receives trigger signal (trigger). The duration of read enable signal (read_en) is set based on burst length and related settings of memory system 500. Because read enable signal (read_en) is generated using data strobe signals (DQS/DQS#), it can be aligned with a certain point of data strobe signals (DQS/DQS#) according to a setting regarding a delay inserted in the generation of read enable signal (read_en). Therefore it is very easy to ensure substantial part of data strobe signals (DQS/DQS#) received by strobe signal receiver 509 being covered on time axis by read enable signal (read_en) received by strobe signal receiver 509, and data signal (DQ) received by data signal receiver 511 being covered on time axis by read enable signal (read_en) received by data signal receiver 511, thus to ensure proper transmission of data strobe signals (DQS/DQS#) and data signal (DQ).

In one embodiment, to further reduce power consumption, in normal mode, strobe signal detector 513 is turned off. In power saving mode, strobe signal detector 513 is turned on only when read command signal (read_command) is detected, and is turned off when a write command signal or an idle signal is detected.

In one embodiment, optionally, read command signal (read_command) is used as a coarse reference for generation of read enable signal (read_en), for example, when enable signal generator 515 receives read command signal (read_command), it prepares to generate read enable signal (read_en), and decides when to generate read enable signal (read_en) using data strobe signals (DQS/DQS#).

We claim:

1. A method for generating a read enable signal which is for controlling reading of a pair of data strobe signals and a data signal in a memory system, the method comprising:
   detecting whether the pair of data strobe signals are both high or low; and
   generating the read enable signal if the pair of data strobe signals are detected being both high or low, where the read enable signal is for controlling the reading of the pair of data strobe signals.

2. The method of claim 1 further comprising:
   generating a trigger signal if the pair of data strobe signals are detected being both high or low, in the method, the read enable signal is generated after the trigger signal is detected.

3. The method of claim 1 the method further comprising:
   generating the pair of data strobe signals, wherein the pair of data strobe signals comprise a segment in which the pair of data strobe signals are both high or low.

4. The method of claim 3, wherein the pair of data strobe signals comprises a trigger segment, a pre-amble segment, and a strobe segment in order of time, in the trigger segment, the pair of data strobe signals are both high or low, in the pre-amble segment and the strobe segment, the pair of data strobe signals are differential signals.

5. The method of claim 1, wherein the pair of data strobe signals and the data signal are generated by a memory chip, the read enable signal is generated by a data exchanging device which exchanges data directly with the memory chip.

6. The method of claim 5, wherein the data exchanging device is a buffer which is mounted on the same memory module with the memory chip.

7. The method of claim 5, wherein the data exchanging device is a memory controller for controlling reading data from and writing data to the memory chip.

8. A data exchanging device for reading in a pair of data strobe signals and a data signal from a memory chip, the data exchanging device comprising:
   an enable signal generator for generating a read enable signal if the pair of data strobe signals are detected being both high or low;
   a strobe signal receiver, connected with the enable signal generator, for reading in the pair of data strobe signals if it receives the read enable signal; and
   a data signal receiver, connected with the enable signal generator, for reading in the data signal if it receives the read enable signal.

9. The data exchanging device of claim 8, wherein the data exchanging device is a buffer mounted on the same memory module with the memory chip.

10. The data exchanging device of claim 8, wherein the data exchanging device is a memory controller for controlling reading data from and writing data to the memory chip.

11. The data exchanging device of claim 8 further comprising a strobe signal detector connected with the enable signal generator, for generating a trigger signal if the pair of data strobe signals are detected being both high or low, in the data exchanging device, the enable signal generator generates the read enable signal after it receives the trigger signal.

* * * * *